United States Patent [19]
Lenz

[11] Patent Number: 4,887,181
[45] Date of Patent: Dec. 12, 1989

[54] CIRCUIT FOR TEMPERATURE PROTECTION WITH HYSTERESIS

[75] Inventor: Michael Lenz, München, Fed. Rep. of Germany

[73] Assignee: Siemens Aktiengesellschaft, Berlin and Munich, Fed. Rep. of Germany

[21] Appl. No.: 89,145

[22] Filed: Aug. 25, 1987

Related U.S. Application Data

[63] Continuation-in-part of Ser. No. 763,830, Aug. 8, 1985, abandoned.

[30] Foreign Application Priority Data

Aug. 10, 1984 [DE] Fed. Rep. of Germany ....... 3429555

[51] Int. Cl.$^4$ ................................................ H02H 5/04
[52] U.S. Cl. .................................... 361/103; 307/310; 313/316; 313/907; 220/207 P; 220/298
[58] Field of Search ............................... 361/103, 106; 220/207 P, 298; 307/310; 223/313, 315, 316, 907

[56] References Cited

U.S. PATENT DOCUMENTS 3,906,310  9/1975  Esashika .............................. 361/103
3,959,713  5/1976  Davis et al. ...................... 361/103 X

*Primary Examiner*—Derek S. Jennings
*Attorney, Agent, or Firm*—Herbert L. Lerner; Laurence A. Greenberg

[57] ABSTRACT

A temperature protection circuit includes a band gap circuit furnishing a first reference voltage being temperature independent. An amplifier circuit connected to the band gap circuit for receiving and amplifying the first reference voltage and supplying a second reference voltage. A negative feedback network is connected to the amplifier circuit for feeding back the second reference voltage to the amplifier circuit, a sensor circuit is connected between the amplifier circuit and the negative feedback network, temperature-determining circuit parts are thermally coupled to the sensor circuit and supply a temperature dependent voltage to the sensor circuit. The sensor circuit compares the second reference voltage with the temperature dependent voltage according to a given comparison criterion, and a control circuit is activated by the sensor circuit if the comparison criterion is fulfilled for controlling the temperature-determining circuit parts. The control circuit includes a feedback of the sensor circuit to the negative feedback network.

17 Claims, 3 Drawing Sheets

FIG 1
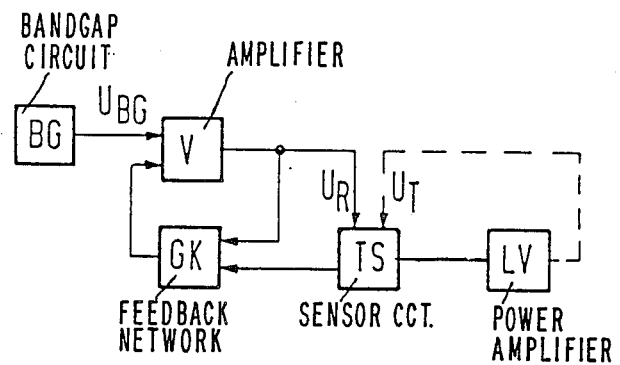
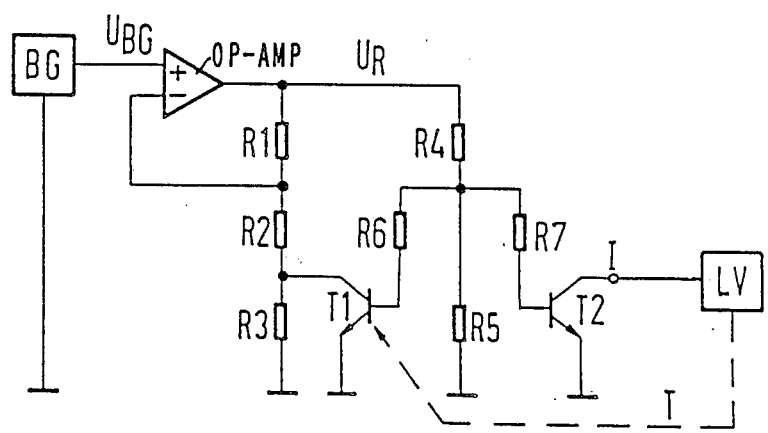
FIG. 2

\* C1 IS BAND-LIMITING

CIRCUIT FOR TEMPERATURE PROTECTION WITH HYSTERESIS

CROSS-REFERENCE TO RELATED APPLICATIONS

This application is a continuation-in-part of application Ser. No. 763,830, filed Aug. 8, 1985, now abandoned.

BACKGROUND OF THE INVENTION

1. Field of the Invention

The invention relates to a circuit including a band gap circuit furnishing a first reference voltage being temperature independent, an amplifier circuit connected to the band gap circuit for receiving and amplifying the first reference voltage and supplying a second reference voltage, a negative feedback network connected to the amplifier circuit for feeding back the second reference voltage to the amplifier circuit, a sensor circuit connected to the amplifier circuit temperature-determining circuit parts thermally coupled to the sensor circuit and generating a temperature dependent voltage within the sensor circuit, the sensor circuit comparing the second reference voltage with the temperature dependent voltage according to a given comparison cirterion, and means being activated by the sensor circuit if the comparison criterion is fulfilled for controlling the temperature-determining circuit parts.

2. Description of the Related Art

Electronic power components, particularly integrated power circuits, require temperature protection against unduly high temperatures in the event of insufficient cooling which can lead to the destruction of the component. Ordinarily, a baseemitter junction of a transistor which is biased with a temperature-independent voltage in the forward direction serves as a temperature sensor. The sensor is activated due to the negative temperature coefficient of its threshold voltage or the positive temperature coefficient of the base current beginning with a given temperature and it reduces the heat loss in the component to be protected. Due to the thermal coupling of the temperature sensor and the power component, a control loop is provided wherein the control of the power loss is customarily achieved by switching the supply voltage for the power component on and off.

With this analog control, so-called pulse-width control, low-frequency sawtooth oscillations with superimposed high-frequency oscillations occur. The low-frequency oscillations occur because the control circuit operates very slowly due to the thermal feedback to the temperature sensor, and the high-frequency oscillations are generated due to the switching transients of the control, i.e., of the transistor used as the temperature sensor.

Particularly in integrated audio amplifier circuits, the low-frequency sawtooth oscillations are troublesome because they are within audible range. The output is at one-half the supply voltage potential of a B output stage which is preferably used in integrated power amplifiers and is connected through an electrolyte capacitor with a high capacity to a loudspeaker at which large current amplitudes occur, that may damage the loudspeaker during the switching processes of the control. The high-frequency oscillations generally lead to shunt currents in the B output stages, the output transistors of which can absorb so much power there that so-called "hot spots" are formed which lead to a local secondary breakdown and destroy the transistor or transistors.

SUMMARY OF THE INVENTION

It is accordingly an object of the invention to provide a circuit for temperature protection with hysteresis, which overcomes the hereinafore-mentioned disadvantages of the heretofore-known devices of this general type, and to do so with higher reliability.

With the foregoing and other objects in view there is provided, in accordance with the invention, a temperature protection circuit, comprising a band gap circuit furnishing a first reference voltage being temperature independent, an amplifier circuit connected to the band gap circuit for receiving and amplifying the first reference voltage and supplying a second amplified reference voltage, a negative feedback network connected to the amplifier circuit for feeding back the second reference voltage to the amplifier circuit, a sensor circuit connected to the amplifier circuit, temperature-determining circuit parts thermally coupled to the sensor circuit and generating a temperature dependent voltage to the sensor circuit, the sensor circuit comparing the second reference voltage with the temperature dependent voltage according to a given comparison criterion, and means being activated by the sensor circuit if the comparison criterion is fulfilled for controlling the temperature-determining circuit parts, and a feedback of the sensor circuit to the negative feedback network.

The circuit according to the invention avoids the occurrence of parasitic oscillations by using positive feedback and causes the power components, particularly integrated power circuits, to be switched on and off in accordance with a hysteresis characteristic. The power components are switched off at a maximally permissible temperature and are switched on again only after the component has cooled off by a temperature valve which can be predetermined. Due to the temperature hysteresis, the power loss is not controlled down and the time between the switching off and switching on process takes several seconds to minutes, depending on the total heat capacity of the power component and on the adjusted hysteresis.

In accordance with another feature of the invention the negative feedback network includes an ohmic voltage divider, and the second amplifier reference voltage is an input voltage of the sensor circuit.

In accordance with an additional feature of the invention, the sensor circuit includes a semiconductor pn-junction biased by a largely temperature-independent voltage and thermally coupled to the temperature-determining circuit parts, at least two transistors controlled by the semiconductor pn-junction, and series base and discharge resistors connected to the transistors.

In accordance with an added feature of the invention, the temperature-determining circuit parts have at least one inhibit input, the at least two transistors include a first transistor controlled by the semiconductor pn-junction and having an output circuit fed back to the negative feedback network, and at least one second transistor controlled by the semiconductor pn-junction and having an output circuit controlling the at least one on/off control circuit.

In accordance with a further feature of the invention the output circuit of the first transistor fed back to the negative feedback network is shunted across an ohmic resistor of the ohmic voltage divider of the negative feedback network.

In accordance with again another feature of the invention, the semiconductor pn-junction is a base emitter path of a transistor biased in the flow direction.

In accordance with again an added feature of the invention the semiconductor pn-junction is a base-emitter path of the first transistor.

In accordance with again an additional feature of the invention, the semiconductor pn-junction is a semiconductor diode biased on the flow direction.

In accordance with again a further feature of the invention, a respective one of the series base resistors is connected to each of the transistors.

In accordance with still an added feature of the invention the series base resistors are of the same magnitude.

In accordance with still another feature of the invention the transistors have base-emitter paths each of the base-emitter paths and the series base resistors being connected in parallel with a respective one.

In accordance with will a further feature of the invention there is provided a shunt resistor being connected in parallel with the base-emitter paths and the series base resistors.

In accordance with yet an added feature of the invention there is provided an ohmic resistor connected in series with the shunt resistor and forming an ohmic voltage divider with the shunt resistor.

In accordance with yet an additional feature of the invention there is provided a semiconductor diode forming the semiconductor pn-junction and being connected in series with the shunt resistor.

In accordance with yet an added feature of the invention, at least one resistor of the voltage divider of the negative feedback network is connected across the base-emitter path of a transistor forming the semiconductor pn-junction, and the output of the transistor is connected in series with the shunt resistor.

In accordance with yet a further feature of the invention, the amplifier circuit has heavy negative feedback with a high open-loop gain.

In accordance with a concomitant feature of the invention the amplifier circuit includes a band width limiter.

Other features which are considered as characteristic for the invention are set for th in the appended claims.

Although the invention is illustrated and described herein as embodied in a circuit for temperature protection with hysteresis, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

BRIEF DESCRIPTION OF THE DRAWINGS

FIG. 1 is a block circuit diagram of a circuit for temperature protection with hysteresis;

FIG. 2a is a block and schematic circuit diagram of a circuit according to the invention;

DESCRIPTION OF THE PREFERRED EMBODIMENTS

Figure 2B:
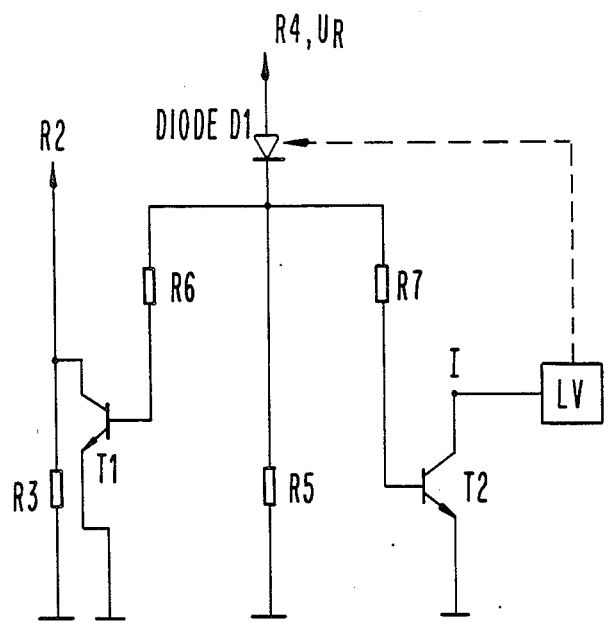
FIG. 2b is a block and schematic circuit diagram being a part of FIG. 2a including a diode in series with a resistor.

Referring now to the figures of the drawings in detail and first, particularly, to FIG. 1 thereof, it is seen that a band gap circuit BG which is known in the art provides a reference voltage $U_{BG}$ which is independent of temperature in a first approximation. An amplifier circuit V which has feedback from the output to the input thereof by a negative feedback network GK, amplifies the reference voltage $U_{BG}$ to a voltage $U_R$. A sensor circuit TS which is thermally coupled to the power component to be protected, especially a power amplifier LV, compares the amplified reference voltage $U_R$ with a temperature-dependent voltage $U_T$. If this comparison criterion is fulfilled, the sensor circuit TS acts on the negative feedback network GK in such a manner that the gain of the amplifier circuit V changes in the direction of positive feedback for the amplifier reference voltage $U_R$. At the same time, the sensor circuit TS switches the power amplifier LV on or off through a shut-off or inhibit input thereof.

The sensing element of the sensor circuit TS is advantageously a semiconductor junction. The amount of current flowing through this junction is a function of the voltage across the junction, the threshold voltage and the temperature. The temperature coefficient of a semiconductor junction is negative. At a voltage below the threshold voltage of the junction only a very small current flows, but above the threshold voltage the current increases steeply. Due to the negative temperature coefficient, the threshold voltage assumes a lower value as the temperature increases. This characteristic of a pn-semiconductor junction is utilized in such a way that a bias voltage is placed across the junction, which e.g. at room temperature, is just below the threshold voltage. As the temperature increases, the threshold voltage goes lower, so that at a certain higher temperature, the threshold voltage goes below the bias voltage. As a result the very small current through the junction suddenly rises to a very high value. In this manner, as is well known in the technology of temperature sensing, a comparison is being made between the externally applied bias voltage and the threshold voltage, which is a material-dependent characteristic. It can also be described in the way that the temperature sensing element provides a current that is a function of the external bias voltage and the threshold voltage of the sensor element.

The positive feedback and the altered gain of the amplified reference voltage $U_R$, causes the comparison criterion to be met with certainty and the switching state of the sensor circuit TS for the power amplifier LV to be maintained reliably until the temperature-dependent voltage $U_T$ which is fed back from the power amplifier LV to the sensor circuit TS has changed in the sense of a negative feedback, in such a manner that the comparison criterion is met again. However, since the signs of the temperature coefficient of the temperature-dependent voltage $U_T$ and of the difference between this voltage $U_T$ and the amplified reference voltage $U_R$ have been reversed relative to the starting state, the comparison criterion is also approached with the reversed sign in this case. The sensor circuit TS therefore acts again on the negative feedback network GK in the sense of a positive feedback for the amplified reference voltage $U_R$ in such a way that the original gain for the negatively fed-back amplifier circuit V is restored. The comparison criterion is therefore likewise met with certainty and at the same time, the sensor circuit TS resets the power amplifier LV to the original operating state.

Depending on the operating state of the sensor circuit, the negatively fed-back amplifier circuit V has two gain factors for the reference voltage $U_{BG}$ and consequently, the amplified reference voltage $U_R$ has two different values. With the comparison criterion remaining the same, the sign of the temperature coefficient of the temperature-dependent voltage $U_T$ or the direction of the approach of this voltage $U_T$ to the comparison criterion is decisive for a change of the outputs of the sensor circuit TS. Thus, a temperature-dependent hysteresis characteristic is obtained, the reversal points of which can be set by the values of the amplified reference voltage $U_R$. Due to the positive feedback loop which is closed by the sensor circuit TS through the negative feedback network GK and the amplifier circuit V, the change, especially of the output of the sensor circuit TS acting on the power amplifier LV, takes place so fast that no parasitic oscillations occur. FIG. 2 shows a detailed embodiment of the circuit according to FIG. 1, wherein the elements that are the same as in FIG. 1 are provided with the same reference symbols.

Band gap circuits are known and are described, for instance, in the book "Halbleiter-Schaltungstechnik" (Semiconductor Circuit Technique) by U. Tietze and Ch. Schenk, 5th Revised Edition, Springer-Verlag, Berlin, Heidelberg, New York, 1980, pages 387 et seq.. such a band gap circuit BG furnishes a voltage $U_{BG}$ which is temperature independent in a first approximation and is fed to the non-inverting input of an operational amplifier OP contained in the amplifier circuit.

The amplified reference voltage $U_R$ at the output of the operational amplifier OP is fed back through a resistor R1 to the inverting input of the operational amplifier OP. The resistor R1 is part of the negative feedback network which also contains resistors R2 and R3 connected in series with the resistor R1 and serves as a voltage divider for the amplified reference voltage $U_R$ which is referred to reference potential. The reference voltage $U_{BG}$ of the band gap circuit is also referred to reference potential.

Shunted across or parallel to the negative feedback network R1 to R2 is a further ohmic voltage divider, formed of resistors R4 and R5 which is connected between the output of the operational amplifier OP delivering the output voltage $U_R$ and ground supplying a reference potential. One lead of the resistor R5 is connected to reference potential. Connected parallel to the resistor R5 are resistors R6 and R7 each being connected in series through the base-emitter path of a respective npn transistor T1 and T2 to reference potential. The collector of the transistor T 1 is connected to the junction point of the resistors R2, R3 of the negative feedback network GK and represents the feedback of the sensor circuit to the negative feedback network. The sensor circuit is formed of the resistors R4 to R7 and the transistors T1 and T2. The collector of the transistor T2 remains open and can be connected by a lead I, for instance, to the inhibit input of a power amplifier LV, as is indicated by a direct line from the collector of T2 to the power amplifier LV in FIG. 2.

The power component to be protected, such as the power amplifier LV, is thermally coupled via the broken line T (FIG. 2) to the transistor T1 and has a temperature characteristic which determines the temperature-dependent threshold voltage $U_T$ of the base emitter junction of the transistor T1, as designated in FIG. 1.

The output circuit of the transistor T1 is connected parallel to the resistor R3 and determines the gain of the operational amplifier OP for the amplified reference voltage $U_R$ through the resistors R1 and R2 of the negative feedback network. The bases of the transistors T1 and T2 are biased by means of the voltage divider R4 and R5; the resistors R6 and R7 serve for symmetrizing.

If the temperature protection has not responded, the power amplifier LV is switched on and the transistors T1 and T2 are cut off. With increasing power loss of the power amplifier LV, the temperature of the pn junction of the transistor T1 thermally coupled to the power amplifier LV is increased. Due to the negative temperature coefficient of the threshold voltage of the pn-junction of the transistor T1, the threshold voltage $U_T$ decreases with increasing temperature T. If the base bias for the transistor T1 which is set by the resistors R4 to R6 is chosen so large that the threshold voltage $U_T$ reaches this base bias exactly at the temperature which is maximally permissible for the power component to be protected, then the transistor T1 is switched into conduction. The voltage dropping across the resistor R3 of the negative feedback network is reduced by the output circuit of the transistor T1 which is then connected in parallel.

At the same time, the voltage taken off at the junction point of the two resistors R1 and R2 which is fed back to the inverting input of the operational amplifier OP decreases and the gain of the operational amplifier OP increases. In this way, the output voltage $U_R$ increases and the base-emitter voltage of the transistor T1 increases through the voltage divider R4 to R6. This positive feedback increases the amplified reference voltage $U_R$ until transistor T1 goes into saturation. With an increase of the amplified reference voltage $U_R$, the base voltage of the transistor T2 also increases, so that transistor T2 is switched into conduction and it acts through the lead I to turn off the power amplifier LV, such as through the inhibit input thereof. When selecting the series base resistors R6 and R7, respectively, care must be taken to ensure that the transistor T2, which must not be coupled thermally to the power amplifier LV, does not switch prior to the transistor T1. The positive feedback causes the amplified reference voltage $U_R$ to rise so fast that the two transistors T1 and T2 can be driven symmetrically without the occurrence of parasitic oscillations when the power amplifier LV is switched off. Specifically, however, it is advantageous if the transistor T2 has less base bias than the transistor T1 while the temperature protection has not responded, and is then switched into conduction slightly later than the transistor T1.

If the temperature is lowered with the power amplifier LV switched off, the threshold voltage $U_T$ of the transistor T1 increases. As soon as the increasing threshold voltage $U_T$ reaches the amplified reference voltage $U_R$, the transistor T1 begins to cut off and the amplified reference voltage $U_R$ is reduced through the negative feedback network R1 to R3 and the operational amplifier OP which is then negatively fed-back more. Due to the repeated positive feedback, the amplified reference voltage $U_R$ very quickly reaches the lower voltage value that is present if the temperature protection has not responded, and the transistors T1 and T2 cut off reliably. Due to the fast shutoff of the transistors T1 and T2 achieved by the positive feedback, no parasitic oscillations occur even when the power amplifier LV is switched on again.

The amplified reference voltage $U_R$ itself is temperature-dependent due to the parasitic properties of the operational amplifier OP. While the offset variables can be compensated for an operating point, this is not the case for its temperature drift. However, these quantities are unimportant in practice since they are at least one order of magnitude smaller than the temperature coefficients of the sensor transistor T1 and the gain of the operational amplifier OP is kept low. The hysteresis characteristics of the amplified reference voltage $U_R$ can be set by the negative feedback network R1 to R3 and the voltage drop across the resistor R3 with the transistor T1 conducting and cut off, respectively. When constructing the circuit, it is not absolutely necessary for the conducting transistor T1 to reach saturation.

In special cases, the combination of the pn-junction and the switching transistor T1 for the negative feedback network R1 to R3 is not necessary. Instead, a diode D1 which is connected in series with the resistor R4, for instance, and is connected with its cathode to the junction point of the resistors R5 to R7, can be provided in addition to the transistors T1 and T2. This makes sense particularly if the transistors T1 and T2 are driven symmetrically. If other criteria for the response of the temperature protection are considered, the diode can also be connected in series with the resistors R6 or R7 and their common junction points. If a diode is connected between the common junction point of the resistors R4 to R7 and the resistor R5, the sign for driving the transistors T1 and T2 changes, so that in this case an additional inverter or a transistor of another type must be provided in order to obtain positive feedback. Instead of the above-described possible connections for a diode, a Zener diode can also be used, although a different direction of poling and the Zener voltage are to be noted.

FIG. 2b shows the element R5, R6, R7, T1 and T2 and the diode D1 inserted in series with resistor R4, connected to the voltage $U_R$ ahead of the nodal point of resistors R5, R6 and R7. This diode. D1, is forward biased by the current flowing from R4; in other words, the diode D1 has its anode connected to R4. The thermal connection between the diode D1 and the amplifier LV is shown as a dashed line between these components.

For Zener voltages below 5.7 volts, the temperature coefficient is negative as for a diode; beyond that, it is positive due to the avalanche effect which then occurs.

Figure 3:
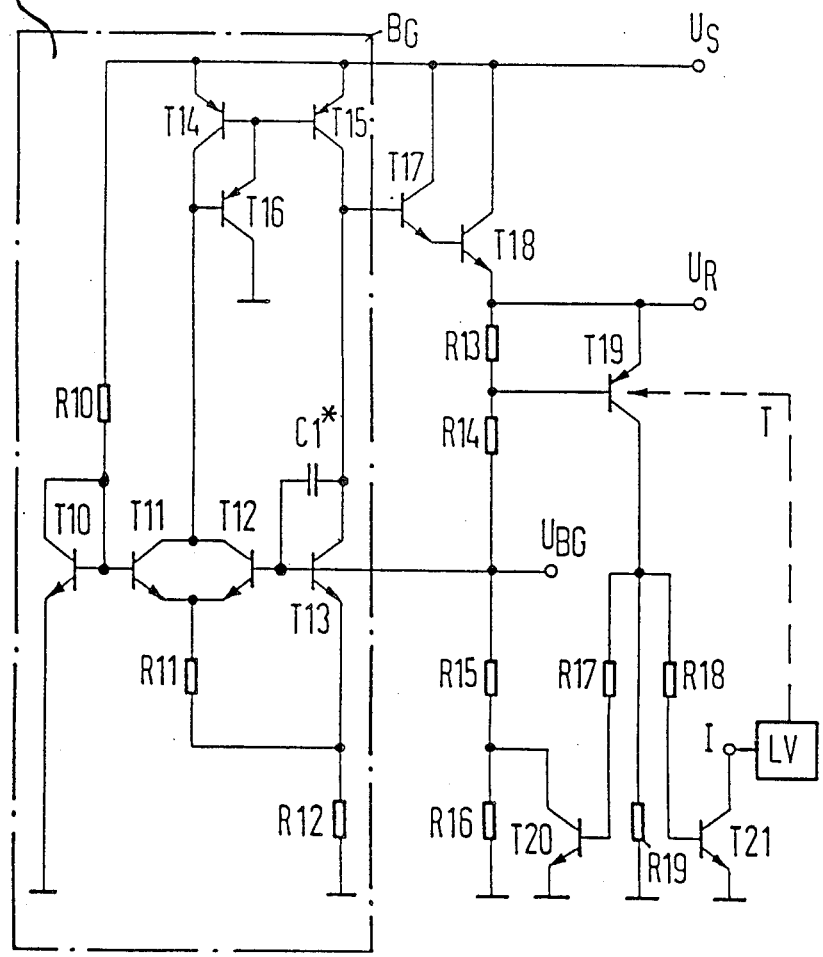
FIG. 3 is a schematic circuit diagram of the circuit according to the invention.

FIG. 3 shows a further embodiment of a circuit according to the invention with a detailed band gap reference and amplifier circuit. The band gap circuit BG illustrated in detail in the circuit portion outlined by a dot-dash line, contains transistors T10 to T16, resistors R10 to R12 and a capacitor C1. The transistors T10 to T13 are of the npn-type and the transistors T14 to T16 are of the pnp-type. The transistor T10 is connected as a diode and the emitter thereof is connected to reference potential, such as to a chassis. A current is impressed in the base of the transistor T10 through the resistor R10 which is connected between this base terminal and a source of a supply voltage $U_S$. Beside being connected to the collector of the transistor T10 and to the resistor R10, the base of the transistor transistor T10 is also connected to the base of the transistor T11, which forms a differential amplifier together with the transistor T12.

The two resistors R11 and R12 which are connected in series relative to the reference potential, serve as the emitter resistance of this differential amplifier stage.

The base of the transistor T12 is connected to the base of the transistor T13. The emitter of the transistor T13 is connected to the junction point of the two resistors R11 and R12. The capacity C1 shunts the base-collector path of transistor T13. The collectors of the differential amplifier transistors T11 and T12 are connected to each other and to the collector of the transistor T14 which forms a current reflector, together with the transistor T15. The collector of the transistor T15 is tied to the collector of the transistor T13. The emitters of the two transistors T14 and T15 are supplied with the voltage $U_S$. The collector of the transistor T16 is connected to the reference potential. The emitter-base path of the transistor T16 is connected parallel to the base-collector path of the transistor T14. The output of the band gap circuit BG is formed by the collected of the transistor T13 which leads to the input of a Darlington amplifier stage which is formed of the transistors T17 and T18. Both of the transistors of the Darlington stage are of the npn-type and are connected with their collectors to the source of the supply voltage $U_S$. The emitter of transistor T17 leads to the base of the transistor T18. The output of the Darlington stage is formed by the emitter of the transistor T18 and is the point at which the amplified reference voltage $U_R$ can be taken off. The negative-feedback network of this circuit according to FIG. 3, is formed by the series-connected resistors R13 to R16 which are located between the emitter of transistor T18 and reference potential. The junction point of the resistors R14 and R15 is connected to the common bases of the transistors T12 and T13 of the band gap circuit BG and carries the band gap voltage $U_{BG}$.

The junction point of the emitter of the transistor T18 and the resistor R13 is connected to the terminal carrying the voltage $U_R$ and to the emitter of the transistor T19 which serves as the temperature sensor. The base of the transistor T19 is tied to the junction point of the two resistors R13 and R14. The collector of the transistor T19 leads to the junction point of the resistors R17 to R19. The resistors R17 and R18 are the respective base series resistors of the transistors T20 and T21, which have emitters that are at reference potential.

The resistor R19 is connected parallel to the base-emitter paths of these transistors T20 and T21 and their base series resistors. The collector of the transistor T20 is connected to the junction point of the resistors R15 and R16, while the collector of transistor T21 is connected to the lead or terminal I and is left open as a rule, such as for driving the turn-off or inhibit input of a power amplifier LV. The power amplified LV is thermally coupled to the transistor T19.

The transistors T10 and T11 serve as a starting circuit in conjunction with the resistor R10. If the supply voltage $U_S$ is switched on, a current which is divided over the base-emitter paths of the transistors T10 and T11 flows through the resistor R10. The current reflector transistor T14 conducts along with the transistor T11 and the current thereof is reflected in the transistor T15 and drives the Darlington amplifier formed of the transistors T17 and T18, which has a high current gain. The voltage drop at the resistors R13 to R16 and at the junction point of the resistors R14 and R15, which is connected to the terminal carrying the potential $V_{BG}$ and which is fed back to the bases of the transistors T12 and T13, respectively, causes the potential at this point to rise. As soon as the threshold voltages of the transistors T12 and T13 are exceeded, the transistor T12 takes over the current of the transistor T11 and the transistor T13 partially takes over the current of the transistor T15. Due to the negative feedback of the collector current of the transistor T13 through the Darlington amplifier stage T17 and T18 and through the negative feedback network to the base of the transistor T13, a constant base voltage adjusts itself at the transistor T13.

The currents flowing in the collector circuits of the transistors T12 and T13 are equal to each other to a high degree, since the collector current through the transistor T13 is reflected very exactly in the transistor T15. This purpose is served by the transistor T16, the base-emitter path of which is connected parallel to the collector-base path of transistor T14 and the base current of which is smaller than the base current of transistors T14 and T15, approximately by the current gain of the transistor T16. Advantageously, a vertical pnp-transistor with a current gain which is about twice as large as that of a lateral pnp-transistor, is therefore chosen for the transistor T16.

The emitter area of transistor T12 is a multiple of the emitter area of the transistor T13, for instance a multiple of 7, so that for equal collector currents, the threshold voltage is lower in the case of the transistor T12 than in the case of the transistor T13. The voltage drop across the base-emitter path of transistor T13 has the same magnitude in this case as the voltage drop across the base-emitter path of transistor T12 and through the series-connected resistor R11. The difference between the two base-emitter voltages of the transistors T12 and T13 appears in an amplified condition at the resistor R12. The temperature coefficient of the voltage $U_{BG}$ then becomes equal to zero in a first approximation, if the ratio of the emitter areas of the transistors T12 and T13 and the resistances of the resistors R11 and R12 are chosen in such a manner that the band gap voltage which may be 1.16 volts in this case, is obtained. The amplifier and the feedback circuit keep this potential constant. The amplified reference voltage $U_R$ is 3.8 volts, for instance. Due to the heavy negative feedback required for this low gain, the bandwidth of this circuit must be limited in order to suppress a possible tendency to oscillate. This is taken care of by the capacitor C1 which feeds the current at the collector of the transistor T13 back to its base.

The current flowing through the resistors R13 to R16 of the negative feedback network which are connected as an ohmic voltage divider, generates a proportional voltage drop at the resistor R13 which biases the emitter-base path of the npntransistor T19 in the flow direction. The emitter-base threshold voltage of the transistor T19 decreases with increasing temperature of the power component such as the power amplifier LV which is to be protected and which is thermally coupled to the transistor T19. As soon as the threshold voltage drops below the amplified reference voltage $U_R$, the output circuit of the transistor T19 conducts and the input circuit of transistor T20 following the collector, switches this transistor into conduction. Since the output circuit of transistor T20 is shunted across the resistor R16, the voltage dropping across the resistor decreases. On the other hand, the amplifier keeps the band gap reference voltage $U_{BG}$ at the junction point of the two resistors R14 and R15 constant, while the current through the resistors R13 to R15 and through the parallel circuit of the resistor R16 and the output circuit of transistors T20 increases. The voltage drop across the resistor R13 and across the emitter-base path of the transistor T19 therefore increases.

The output current of the transistor T19 acts on the transistor T20 in the sense of a positive feedback for the emitter-base path of the transistor T19, until the transistor T20 goes into saturation. In an analogous manner, the explanations given in connection with FIG. 2 apply to the switching behavior of the transistor T21, the output of which acts on the turn-off input of the power amplifier LV, for instance. The transistor T21 may switch simultaneously with the transistor T20, but advantageously not before.

Because of the fast turn-off of the sensor circuit due to the positive feedback, it is immaterial whether or not the transistor T19 goes into saturation. The transistor T19 can also be replaced by a diode or a Zener diode according to the explanation given for FIG. 2. However, the diode bias can be set more simply according to FIG. 3 by means of the transistor T19 and the resistor R13, without the reaction acting on the negative-feedback network being brought to bear.

If the temperature of the power component such as the power amplifier LV decreases, and the threshold voltage of transistor T19 increases, the switching process is repeated in the reverse direction. First, the transistor T20 comes out of saturation so that the voltage drop at the resistor R16 increases, the current through the negative-feedback network decreases, and the emitter-base voltage for the transistor T19 likewise decreases. Due to the renewed positive coupling, the transistors T20 and T21 are turned off very fast, so that the power amplifier LV can be connected again without the occurrence of parasitic oscillations. The resistor R19 serves as a clean-out resistor which statically places the bases of the transistors T20 and T21 at reference potential after the transistor T19 is disconnected. In the case of a typical change of the baseemitter voltage of the transistor T19 of 50 mV and a temperature coefficient of the pnp-junction of $-2$ mV/K, the temperature difference for switching off and on of the power amplifier LV, for instance, is 25 K. The switching hysteresis can be set by the current through the negative-feedback network R13 to R16 and the choice of the resistance of the resistor R13.

I claim:

1. Temperature protection circuit, comprising a band gap circuit furnishing a first reference voltage being temperature independent, an amplifier circuit, having temperature-determining circuit parts, connected to said band gap circuit for receiving and amplifying said first reference voltage and supplying a second reference voltage, a negative feedback network connected to said amplifier circuit for feeding back said second reference voltage to said amplifier circuit, a sensor circuit connected to said amplifier circuit temperature-determining circuit parts thermally coupled to said sensor circuit and generating a temperature dependent voltage within said sensor circuit, said sensor circuit comparing said second reference voltage with said temperature dependent voltage according to a given comparison criterion, input means being activated by said sensor circuit if said comparison criterion is fulfilled for controlling the temperature-determining circuit parts, and a feedback of said sensor circuit to said negative feedback network.

2. Circuit according to claim 1, wherein said negative feedback network includes an ohmic voltage divider, and said second reference voltage is an input voltage of said sensor circuit.

3. Circuit according to claim 2, wherein said sensor circuit includes a semiconductor pn-junction biased by a largely temperature-independent voltage and thermally coupled to the temperature-determining circuit parts, at least two transistors controlled by said semiconductor pn-junction, and series base and discharge resistors connected to said transistors.

4. Circuit according to claim 3, wherein the temperaturedetermining circuit parts have at least one inhibit-input, said at least two transistors include a first transistor controlled by said semiconductor pn-junction and having an output circuit fed back to said negative feedback network, and at least one second transistor controlled by said semiconductor pn-junction and having an output circuit controlling the at least one inhibit-input.

5. Circuit according to claim 4, wherein said output circuit of said first transistor fed back to said negative feedback network is shunted across an ohmic resistor of said ohmic voltage divider of said negative feedback network.

6. Circuit according to claim 3, wherein said semiconductor pn-junction is a base-emitter path of a transistor biased in the flow direction.

7. Circuit according to claim 4, wherein said semiconductor pn-junction is a base-emitter path of said first transistor.

8. Circuit according to claim 3, wherein said semiconductor pn-junction is a semiconductor diode biased on the flow direction.

9. Circuit according to claim 3, wherein a respective one of said series base resistors is connected to each of said transistors.

10. Circuit according to claim 3, wherein said series base resistors are of the same magnitude.

11. Circuit according to claim 3, wherein said transistors have base-emitter paths each of said base-emitter paths and said series base resistors being connected in parallel with a respective one.

12. Circuit according to claim 11, including a shunt resistor being connected in parallel with said base-emitter paths and said series base resistors.

13. Circuit according to claim 12, including an ohmic resistor connected in series with said shunt resistor and forming an ohmic voltage divider with said shunt resistor.

14. Circuit according to claim 12, including a semiconductor diode forming said semiconductor pn-junction and being connected in series with said shunt resistor.

15. Circuit according to claim 12, wherein at least one resistor of said voltage divider of said negative feedback network is connected across the base-emitter path of a transistor, and is connected in series with said shunt resistor forming said semiconductor pn-junction, forming said semiconductor pn-junction and is connected in series with said shunt resistor.

16. Circuit according to claim 1, wherein said amplifier circuit has heavy negative feedback with a high gain.

17. Circuit according to claim 1, wherein said amplifier circuit includes a band width limiter.

* * * * *